US010658849B2

(12) United States Patent
Syouda

(10) Patent No.: US 10,658,849 B2
(45) Date of Patent: May 19, 2020

(54) CHARGING RATE LEVELING DEVICE AND POWER SUPPLY SYSTEM

(71) Applicant: Yazaki Corporation, Tokyo (JP)

(72) Inventor: Takahiro Syouda, Susono (JP)

(73) Assignee: Yazaki Corporation, Tokyo (JP)

( * ) Notice: Subject to any disclaimer, the term of this patent is extended or adjusted under 35 U.S.C. 154(b) by 294 days.

(21) Appl. No.: 15/382,784

(22) Filed: Dec. 19, 2016

(65) Prior Publication Data

US 2017/0098940 A1 Apr. 6, 2017

Related U.S. Application Data

(63) Continuation of application No. PCT/JP2015/064187, filed on May 18, 2015.

(30) Foreign Application Priority Data

Jul. 24, 2014 (JP) .................. 2014-150804

(51) Int. Cl.
*H02J 7/00* (2006.01)
*G01R 31/3835* (2019.01)
(Continued)

(52) U.S. Cl.
CPC ........ *H02J 7/0016* (2013.01); *G01R 31/3835* (2019.01); *H01M 10/441* (2013.01);
(Continued)

(58) Field of Classification Search
CPC ...... H02J 7/0016; H02J 7/0021; H01M 10/48; B60L 2270/547; B60L 58/22
(Continued)

(56) References Cited

U.S. PATENT DOCUMENTS 8,896,146 B2    11/2014  Tran et al.
2007/0188125 A1*  8/2007  Shepard .................. B60K 6/46
                                                            318/778
(Continued)

FOREIGN PATENT DOCUMENTS

JP      10-285818 A   10/1998
JP     2001-103614 A   4/2001
(Continued)

OTHER PUBLICATIONS

International Search Report dated Jul. 21, 2015, issued for PCT/JP2015/064187.
(Continued)

*Primary Examiner* — Richard Isla
*Assistant Examiner* — Johali A Torres Ruiz
(74) *Attorney, Agent, or Firm* — Locke Lord LLP

(57) ABSTRACT

Provided are a charging rate leveling device and a power supply system including the charging rate leveling device capable of leveling more quickly a charging rate of a plurality of battery cells a battery pack includes. In the power supply system a controlling device includes a two-way DC/DC convertor connected to an auxiliary battery separated from the battery pack, a switch array capable of selectively connecting each of the plurality of auxiliary battery cells the battery pack includes to the two-way DC/DC convertor, so as to charge the battery cell with electric power of the auxiliary battery, and a controller controlling the switch array to connect the lowest voltage battery cell selected among the plurality of battery cells, so as to reduce a difference between charging rates SOC of each of the plurality of battery cells.

4 Claims, 8 Drawing Sheets

(51) Int. Cl.
  *H01M 10/48* (2006.01)
  *H01M 10/44* (2006.01)
  *H02J 7/34* (2006.01)

(52) U.S. Cl.
  CPC ......... *H01M 10/48* (2013.01); *H01M 10/482* (2013.01); *H02J 7/0019* (2013.01); *H02J 7/0021* (2013.01); *H02J 7/342* (2020.01); *Y02T 10/7055* (2013.01)

(58) Field of Classification Search
  USPC .......................................... 320/112, 118, 119
  See application file for complete search history.

(56) References Cited

U.S. PATENT DOCUMENTS

| | | | |
|---|---|---|---|
| 2007/0257642 A1* | 11/2007 | Xiao | H02J 7/0026 320/134 |
| 2009/0267566 A1* | 10/2009 | Yano | H02J 7/0016 320/118 |
| 2010/0225164 A1* | 9/2010 | Tran | B60R 16/0315 307/10.1 |
| 2011/0127962 A1* | 6/2011 | Murao | H02J 7/0016 320/118 |
| 2011/0248675 A1* | 10/2011 | Shiu | H01M 10/4207 320/118 |
| 2014/0042816 A1* | 2/2014 | Hernandez | H02J 1/00 307/71 |
| 2015/0077061 A1* | 3/2015 | Nomura | H01M 10/441 320/126 |

FOREIGN PATENT DOCUMENTS

| | | |
|---|---|---|
| JP | 2007-006552 A | 1/2007 |
| JP | 2009-055687 A | 3/2009 |
| JP | 2010-213564 A | 9/2010 |
| JP | 2011-061955 A | 3/2011 |
| JP | 2013-013292 A | 1/2013 |

OTHER PUBLICATIONS

Office Action dated Nov. 6, 2018, issued for the Japanese patent application No. 2014-150804 and English translation thereof.
Reconsideration Report by Examiner before Appeal drafted Mar. 25, 2019, issued for the Japanese patent application No. 2014-150804 and English translation thereof.

* cited by examiner

CHARGING RATE LEVELING DEVICE AND POWER SUPPLY SYSTEM

FIELD OF THE INVENTION

The present invention is related to a charging rate leveling device leveling a charging rate of a plurality of cells a battery pack includes and a power supply system having the same.

DESCRIPTION OF THE RELATED ART

In various vehicles such as an electric vehicle (EV) running with an electric motor, or a hybrid electric vehicle (HEV) running together with an engine and an electric motor, mounted as a power source for electric motor is a battery module including a battery pack having a plurality of battery cells (unit cell) composed of a secondary battery such as lithium ion battery or nickel hydride battery.

Since a large electric power is required for operating such electric motor, a plurality of battery cells is connected in series in order to output high voltage in the battery module. For the plurality of such battery cells of the battery module, resulting from individual difference or deviation of circumferential temperature, a part battery cells may degrade more quickly than other battery cells. Then, the degraded battery cell, as decreasing in chargeable capacity (current capacity, electric power), may complete in charging before the other battery cells not-degraded completes in charging or complete in discharging before the other battery cells complete in discharging. Because charge or discharge of the battery module is made in conformity with degraded battery cells, the other battery cells not degraded cannot be fully consumed, resulting in actual decrease of whole capacity of battery module in conformity with the battery cell degraded.

Thus, for example, in the technology recited in the Patent Document 1, arbitrary battery cells of a plurality of battery cells are selectively connected to an inductor, energy of the higher voltage battery cell is charged in the inductor, the energy which is charged in the inductor is transferred to the lower voltage battery cell, thereby effectively leveling voltage of each battery cells.

CITATION LIST

Patent Document 1: Japanese Patent Publication number 2013-13292

SUMMARY OF INVENTION

Technical Problem

Disadvantageously, in the Patent Document 1, as the energy is transferred via the inductor, a quantity of energy capable of transferring once is small, it is therefore necessary to repeatedly transfer energy, there were problems posed that operation to level a state of each of battery cells was complicated and required time. In the case that much degraded battery cell exists because of such failure, the problem above became significant.

The present invention intends to solve the concerned problems. Namely, an object of the present invention is to provide a charging rate leveling device capable of quickly leveling charging rate of a plurality of battery cells a battery pack includes and a power supply system including this charging rate leveling device.

Means for Solving the Problem

In order to solve the above problems, a charging rate leveling device of a first aspect of the present invention, which is the charging rate leveling device leveling charging rate of a plurality of battery cells a battery pack includes, includes: a battery cell charger connected to an auxiliary battery separated from the battery pack; a charging connection selector capable of selectively connecting each of the plurality of battery cells to the battery cell charger, so as to charge the battery cell with electric power of the auxiliary battery; a connection selection controller controlling the charging connection selector to connect one battery cell selected from the plurality of battery cells to the battery cell charger so as to reduce a difference between charging rates of each of the plurality of battery cells.

Herein, the charging rate leveling device may further include: an auxiliary battery charger connected to the auxiliary battery; a discharging connection selector capable of selectively connecting each of the plurality of battery cells to the auxiliary battery charger, so as to charge the auxiliary battery with electric power of the battery cell, wherein the connection selector controller further controls the charging connection selector to connect one battery cell selected from the plurality of battery cells to the auxiliary battery charger so as to reduce the difference between charging rates of each of the plurality of battery cells.

Preferably, the charging rate leveling device may further include: a battery cell detector detecting a highest voltage battery cell and a lowest voltage battery cell, the highest voltage battery cell having a highest voltage between both electrodes and the lowest voltage battery cell having a lowest voltage between both electrodes, among the plurality of battery cells; a charging rate detector detecting a charging rate of the highest voltage battery cell and a charging rate of the lowest voltage battery cell, wherein the connection selector controller, when at least one of the charging rate of the highest voltage battery cell and the charging rate of the lowest voltage battery cell falls out of a range of a reference charging rate and a difference value between the charging rates exceeds a difference upper limit value, controls the discharging connection selector to connect the highest voltage battery cell to the auxiliary battery charger, and controls the charging connection selector to connect the lowest voltage battery cell to the battery cell charger.

Preferably, the battery cell detector may include one voltage detector, and a voltage detecting connection selector capable of selectively connecting each of the plurality of battery cells to the voltage detector, wherein the voltage detecting connection selector is configured to also serve as the discharging connection selector by allowing each of the plurality of battery cells to be selectively connected also to the auxiliary battery charger.

Alternatively, the charging rate leveling device may further include: a battery cell detector detecting a highest voltage battery cell and a lowest voltage battery cell, the highest voltage battery cell having a highest voltage between both electrodes and the lowest voltage battery cell having a lowest voltage between both electrodes, among the plurality of battery cells; a charging rate detector detecting a charging rate of the highest voltage battery cell and a charging rate of the lowest voltage battery cell, wherein the connection selector controller, when a difference value between the charging rate of the highest voltage battery cell and the charging rate of the lowest voltage battery cell exceeds a difference upper limit value, controls the charging connection selector to connect the lowest voltage battery cell to the battery cell charger.

In order to solve the above problems, a power supply system of a second aspect of the present invention includes a battery pack, and a charging leveling device leveling a charging rate of a plurality of battery cells the battery pack includes, wherein the charging rate leveling device includes any one of above charging rate leveling devices.

Advantages of the Invention

According to the charging rate leveling device that is the first aspect of the present invention, since the charging rate leveling device includes: a battery cell charger connected to an auxiliary battery separated from the battery pack; a charging connection selector capable of selectively connecting each of the plurality of battery cells to the battery cell charger, so as to charge the battery cell with electric power of the auxiliary battery; a connection selection controller controlling the charging connection selector to connect one battery cell selected from the plurality of battery cells to the battery cell charger so as to reduce a difference between charging rates of each of the plurality of battery cells, for example, the battery cell of which the charging rate is relatively low is connected to the battery cell charger so as to charge the concerned battery cell with electric power of the auxiliary battery capable of storing relatively large electric charge, namely, to transfer the electric charge such that a difference in charging rate among the plurality of battery cells. Thus, large electric charge can be transferred by one transferring operation, and thereby further reducing the transferring operations, and quickly leveling each charging rate of the plurality of battery cells the battery pack includes.

Since the charging rate leveling device further includes: an auxiliary battery charge connected to the auxiliary battery; a discharging connection selector capable of selectively connecting each of the plurality of battery cells to the auxiliary battery charger, so as to charge the auxiliary battery with electric power of the battery cell, wherein the connection selection controller further controls the charging connection selector to connect one battery cell selected from the plurality of battery cells to the auxiliary battery charger so as to reduce the difference between charging rates of each of the plurality of battery cells, the battery cell of which charging rate is relatively high is connected to the auxiliary battery charger for example, it is possible to charge the auxiliary battery capable of charging relatively larger electric charge with the electric power of the battery cell, namely, to transfer electric charge. Because one transferring operation thus allows for transferring large electric charge, it is possible to reduce transferring operation of the electric charge, and quickly leveling each charging rate of the plurality of battery cells the battery pack includes.

Since the charging rate leveling device includes: a battery cell detector detecting a highest voltage battery cell and a lowest voltage battery cell, the highest voltage battery cell having a highest voltage between both electrodes and the lowest voltage battery cell having a lowest voltage between both electrodes, among the plurality of battery cells; a charging rate detector detecting a charging rate of the highest voltage battery cell and a charging rate of the lowest voltage battery cell, wherein the connection selector controller, when at least one of the charging rate of the highest voltage battery cell and the charging rate of the lowest voltage battery cell falls out of a range of a reference charging rate and a difference value between the charging rates exceeds a difference upper limit value, controls the discharging connection selector to connect the highest voltage battery cell to the auxiliary battery charger, and controls the charging connection selector to connect the lowest voltage battery cell to the battery cell charger, the highest voltage battery cell and the lowest voltage battery cell are thought to be large in difference in charging rate from the other battery cell, and it is possible to transfer electric charge therebetween via the auxiliary battery, allowing for more quickly leveling each of charging rate of the plurality of battery cells the battery pack includes.

The battery cell detector includes one voltage detector, and voltage detecting connection selector able to electively connect the voltage detector to each of the plurality of battery cells, the voltage detecting connection selector is configured to serve as the discharge connection selector by enabling each of the plurality of battery cells to selectively connect to the auxiliary battery charger as well, and thereby part composing the connection selector can be reduced and production cost can also be reduced.

The lowest voltage battery cell of the voltage between both electrodes of which voltage between both electrodes is lowest is supposed to be large in the difference in the charging rate from the other battery cells. Thus, a battery cell detector detecting a highest voltage battery cell and a lowest voltage battery cell, the highest voltage battery cell having a highest voltage between both electrodes and the lowest voltage battery cell having a lowest voltage between both electrodes, among the plurality of battery cells; a charging rate detector detecting a charging rate of the highest voltage battery cell and a charging rate of the lowest voltage battery cell, wherein the connection selector controller, when a difference value between the charging rate of the highest voltage battery cell and the charging rate of the lowest voltage battery cell exceeds a difference upper limit value, controls the charging connection selector to connect the lowest voltage battery cell to the battery cell charger, it is possible to transfer charge from the auxiliary battery to the lowest voltage battery cell, and to more quickly level each of charging rate of the battery cells the battery pack includes.

According to the second aspect of the present invention, since the charging rate leveling device is composed of any above mentioned charging rate leveling device, for example, connection of the battery cell of which charging rate is relatively small to the battery cell charger so as to charge the concerned battery cell with the auxiliary battery capable of storing relatively large electric charge, namely, electric charge can be transferred so as to reduce the difference of each of the charging rate of the plurality of battery cells. Therefore, because of allowing for transfer of large electric charge at one transferring operation, it is possible to reduce transferring operation of electric charge, allowing for each of leveling charging rate of the plurality of battery cells the battery charge includes.

DETAILED DESCRIPTION

First Embodiment

Hereinafter, regarding a charging rate leveling device of the first embodiment of the present invention and a power supply system including the same will be explained with reference to FIGS. 1 to 5.

Figure 1:
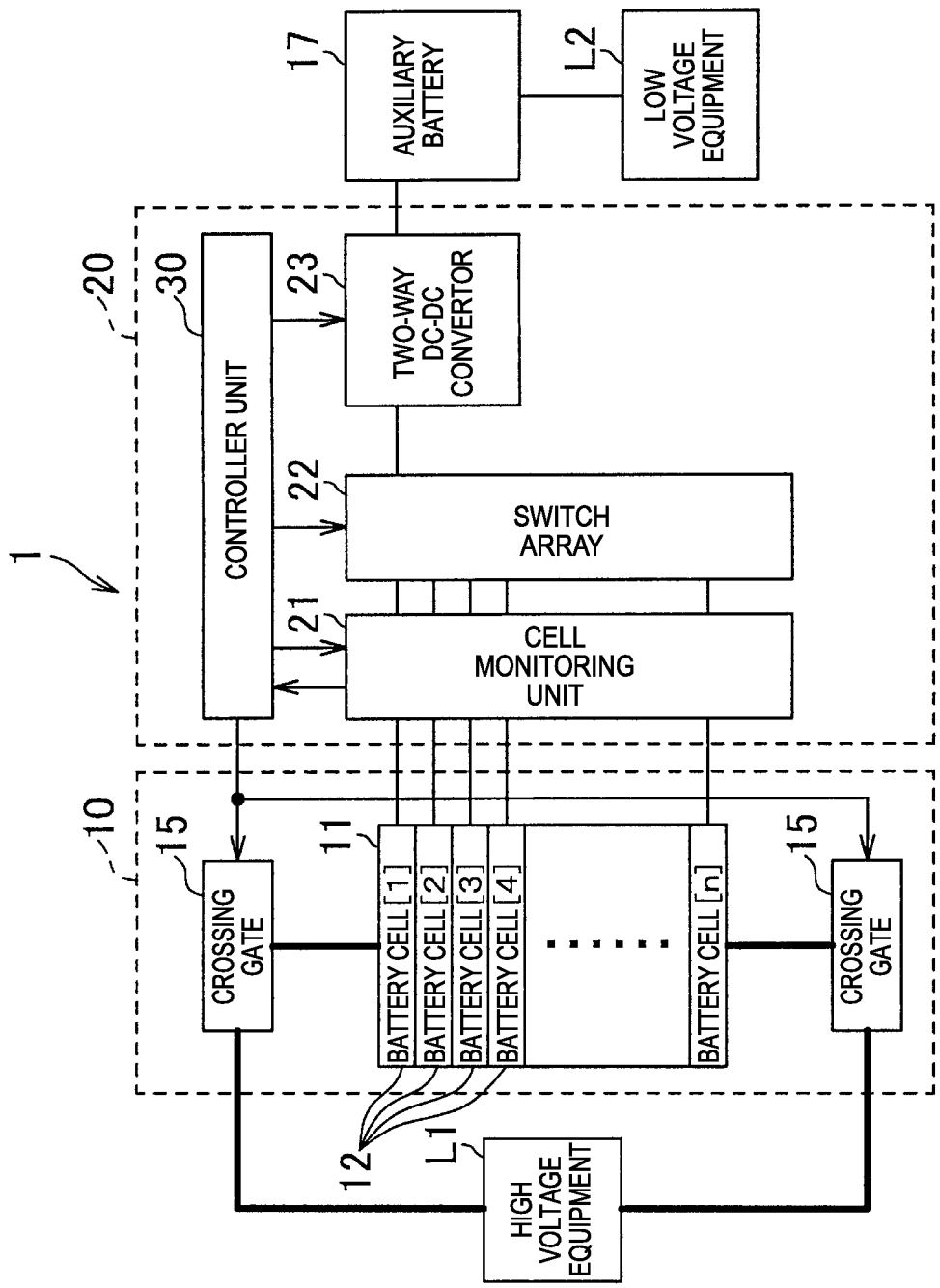
FIG. 1 is a view illustrating a power supply system of the first aspect of the present invention.
Figure 2:
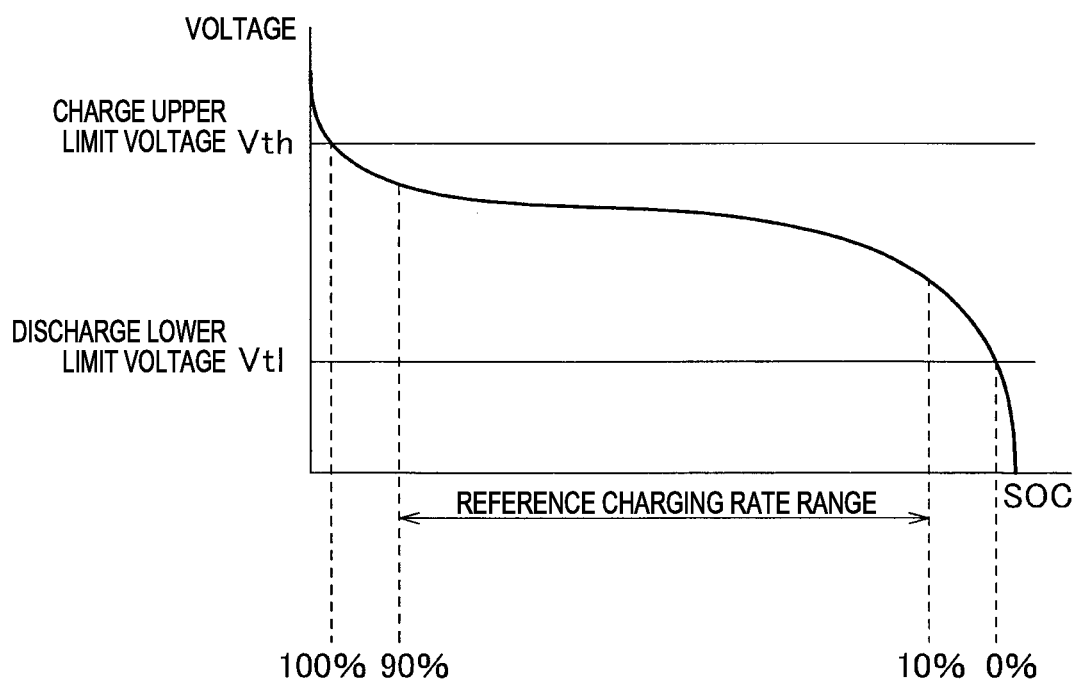
FIG. 2 is a view schematically illustrating one example of relationship between both electrodes of a battery cell the pack of the power system in FIG. 1 includes and charging rate.
Figure 3:
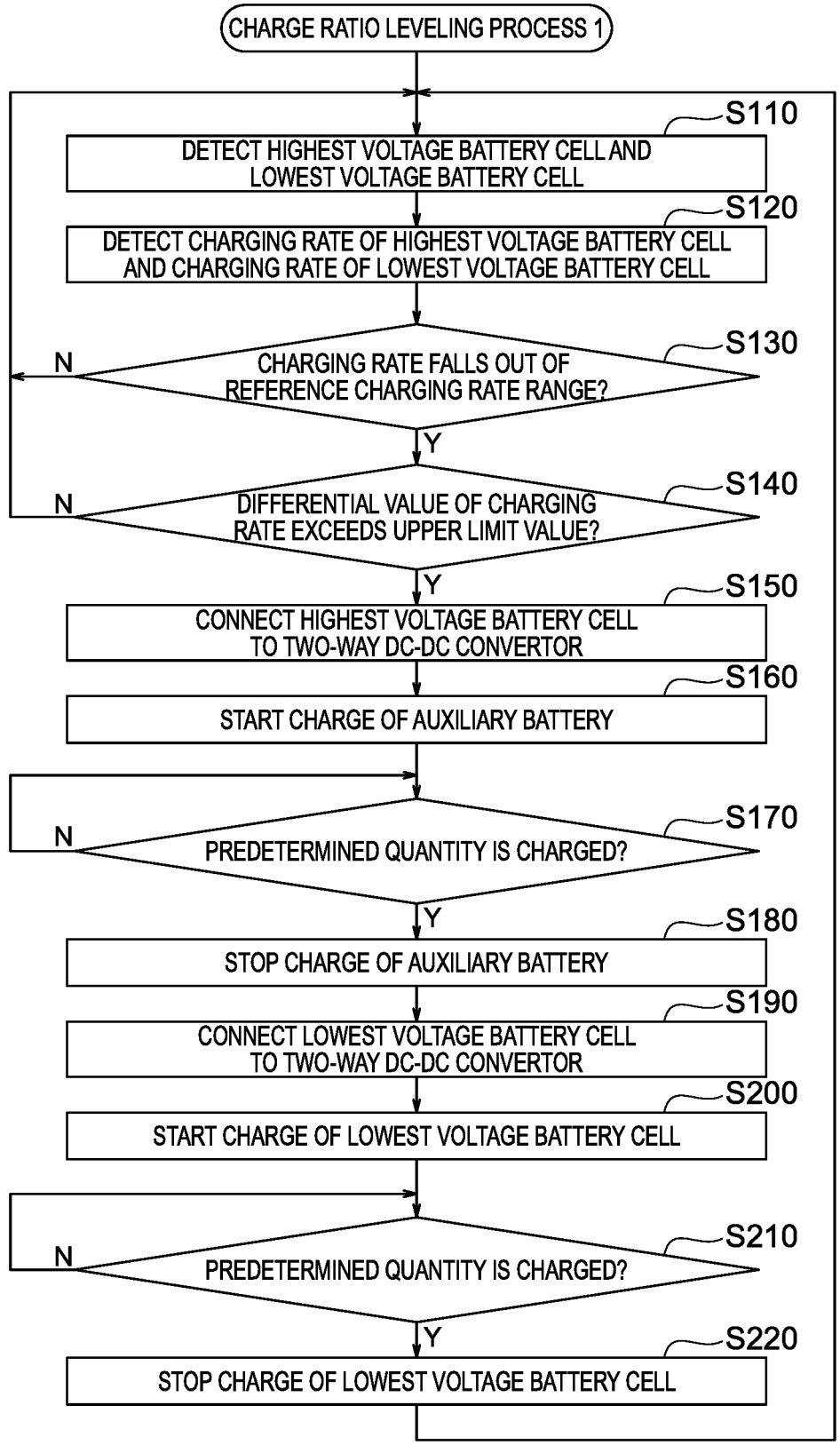
FIG. 3 is a flowchart illustrating one example of charging rate leveling process 1 a controller of a control device in the power supply system in FIG. 1 performs.
Figure 4:
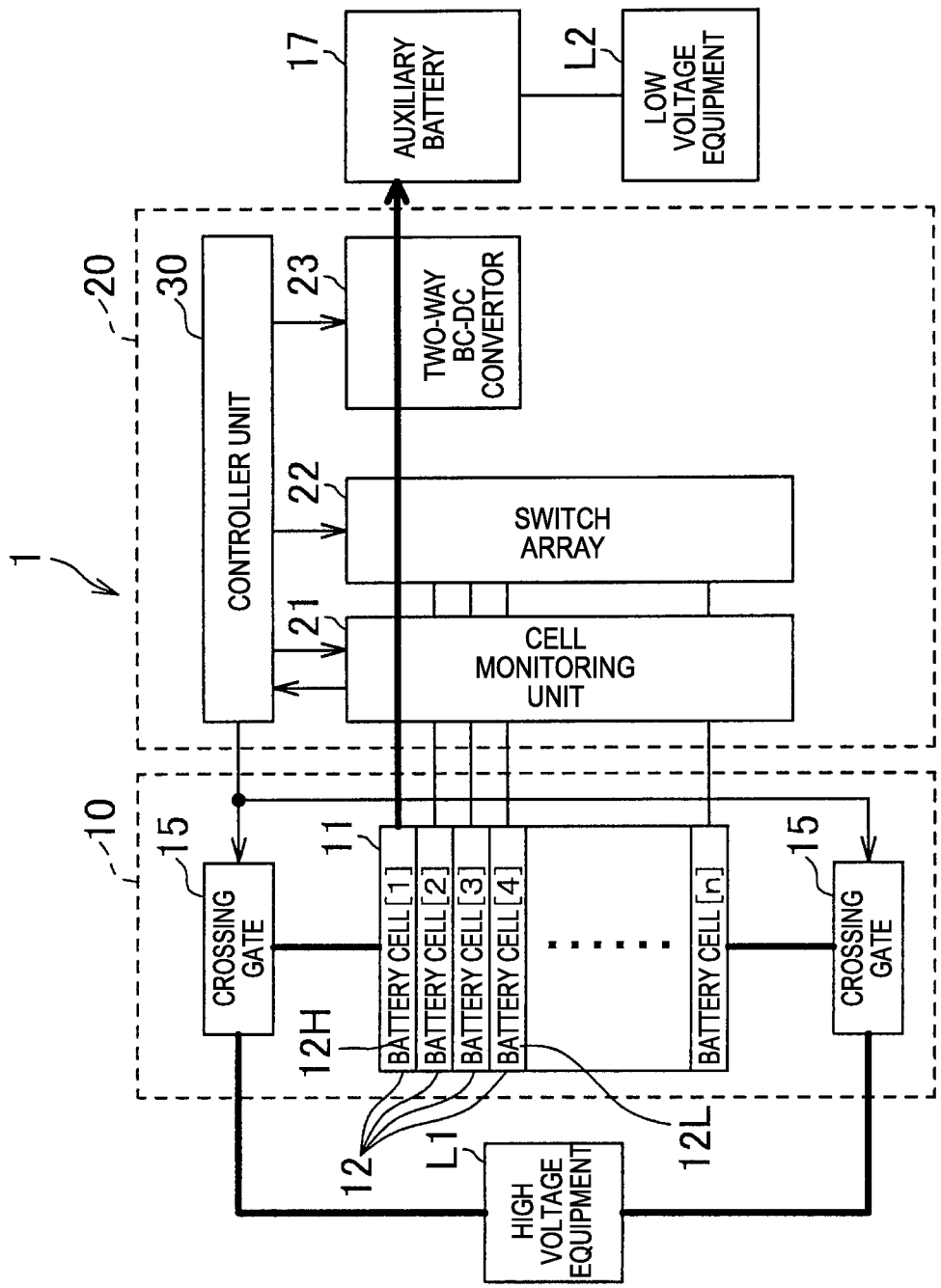
FIG. 4 is a view schematically illustrating transferring of electric charge from the battery cell to the auxiliary battery in the power supply system in FIG. 1.
Figure 5:
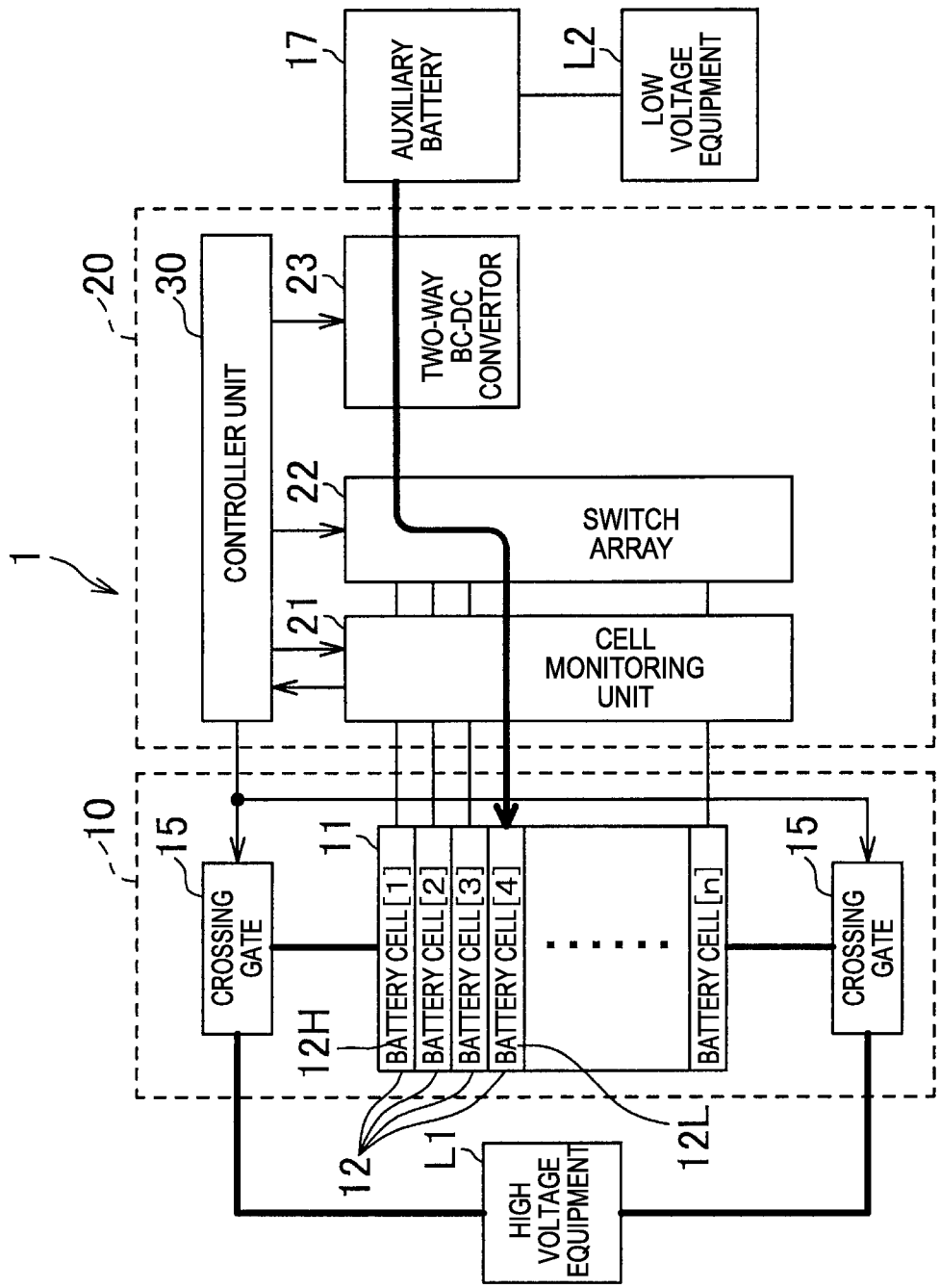
FIG. 5 is a view schematically illustrating transferring of electric charge from the auxiliary battery to the battery cell in the power supply system in FIG. 1.

FIG. 1 is a view illustrating a schematic configuration of a power supply system of the first embodiment of the present invention. FIG. 2 is a view schematically illustrating relationship between a voltage between both electrodes of a battery cell a battery pack of the power supply system in FIG. 1 includes and a charging rate. FIG. 3 is a flowchart illustrating one example of charging rate leveling process 1 a controller of control device of the power supply system in FIG. 1 performs. FIG. 4 is a view schematically illustrating transferring electric charge from the battery cell to the auxiliary battery in the power supply system in FIG. 1. FIG. 4 is a view schematically illustrating transferring of electric charge from a battery cell to the auxiliary battery in the power supply system in FIG. 1. FIG. 5 is a view schematically illustrating transferring of electric charge from the auxiliary battery in the power supply system in FIG. 1.

The power supply system of the present invention, which is mounted in a vehicle such as an electric vehicle for example, is intended to supply electric power to a high voltage equipment such as electric motor of the vehicle and level (balance) charging rate of a plurality of battery cells the battery pack includes, and thus can output more electric power. Of course, the present invention may be applied to a device or system instead of such as an electric vehicle.

Charging rate of the battery cell (SOC; State of Charge) includes a ratio of current electric storage amperage with respect to electric storage capable current capacity (SOCi) or a ratio of current electric storage electric power with respect to electric capable electric power capacity (SOCp), but any charging rate may be applied, and the present embodiment denotes simply charging rate (SOC). Moreover a degradation level of the battery cell (SOH; state of health) denotes a ratio of current electric storage capable capacity with respect to initial electric storage capacity.

As shown in FIG. 1 a power supply system of the present embodiment (denoted as reference numeral 1 in figures) is provided with a battery module 10, an auxiliary battery 17, and a control device 20 as a charging rate leveling device.

A battery module 10 includes a battery pack 11, and a crossing gate 15 connected in series between the battery pack 11 and the high voltage equipment L1. The battery pack 11 includes a plurality of battery cell 12, which is connected to each other in serious. A secondary cell is used for the battery cell 12 such as lithium ion battery or nickel hydrogen battery for example. The battery cell 12 may be a single cell or a combination in which a plurality of single cells is connected in series or in parallel.

Such battery cell 12 includes an electromotive force part e and an internal resistance r. The battery cell 12 generates a voltage v between both electrodes, this voltage v is defined by a voltage ve generated by electromotive force by the electromotive force part e and a voltage vr generated by current flowing through the internal resistance r (v=ve+vr). In the battery cell 12, the internal resistance r changes in accordance with the degradation level SOH, namely, allowing estimating by the internal resistance r the state of charge of the battery cell 12.

The auxiliary battery 17 is constituted by such a lead storage battery supplying electric power to low voltage equipment L2. The auxiliary battery 17 also supplies electric power to a control device 20. The auxiliary battery 17 may be a secondary cell such as lithium ion battery or nickel hydrogen battery other than lead storage battery.

The control device 20 includes a cell monitoring unit 21, a switch array 22, a two-way DC-DC convertor 23, and a controller 30.

The cell monitoring unit 21, which is for example constituted by a plurality of analog switch or relay device, is arranged capable of selectively connecting each of the plurality of battery cells 12 the battery pack 11 includes to a controller 30 mentioned below. The cell monitoring unit 21 switches connection through control signal from the controller 30 to connect the one battery cell 12 designated by the controller among the plurality of battery cells 12 to the controller 30. The controller 30 detects voltage between both electrodes of the connected battery cell 12. The cell monitoring unit 21 corresponds to a part of the battery cell detector (namely, voltage detecting connection selector). The controller 30 corresponds to the voltage detector.

The switch array 22, which is for example constituted by a plurality of analog switches or relay devices, is arranged capable of selectively connecting each of the plurality of battery cells 12 the battery packs 11 includes to a two-way DC-DC convertor 23 mentioned below. The switch array 22 switches connection through the controller 30 to connect one battery cell 12 designated by the controller among the plurality of battery cell 12 to the two-way DC-DC convertor 23. The switch array 22 is capable of turning on electricity in both directions between the battery cell 12 and the two-way DC-DC convertor 23. The switch array 22 corresponds to charging connection selector and the discharging connection selector.

The two-way DC-DC convertor 23 a voltage convertor converting direct current inputted from one terminal into different direct voltage which is outputted from another terminal, and converting direct current inputted from the other terminal into different voltage which is outputted from the one terminal. In the two-way DC-DC convertor 23, the one terminal is selectively connected to the plurality of battery cells 12 the battery pack 11 includes through the switch array 22, the other terminal is connected to the auxiliary battery 17. The two-way DC-DC convertor 23 charges the auxiliary battery 17 with electric power from the battery cell 12, and charges the battery cell 12 with electric power from the auxiliary battery 17. In the present embodiment, the auxiliary battery 17 was connected to the two-way DC-DC convertor 23 and the low battery equipment L2, but is not limited thereto. The auxiliary battery 17 may be only connected to the two-way DC-DC convertor 23, and configured to charge and discharge with the battery cell 12 through the two-way DC-DC convertor 23 and the switch array 22. The two-way DC-DC convertor 23 corresponds to the battery cell charger and the auxiliary battery charger.

The controller 30, which is constituted by such microcomputer having built-in CPU, ROM, and RAM, controls wholly the power supply system 1. In the ROM a control program is pre-stored to allow the CPU to function as various means such as connection selection control, battery cell detector, and charging rate detector or the like. The CPU, executing this control program, serves as the above various means. Furthermore, in the ROM various parameters (reference charging rate range or differential upper limit) are stored, which are used in charging rate leveling process 1 mentioned below.

The controller 30 is provided with a plurality of output ports, and these output ports are connected to the cell monitoring unit 21, the switch array 22, and the two-way DC-DC convertor 23. The controller 30 outputs control signal from the output ports to switch connection of the cell monitoring unit 21 and the switch array 22, and control operation of the two-way DC-DC convertor 23, or the like. Moreover, the output ports of the controller 30 are also connected to the crossing gate 15 of the battery module 10, to output control signal from the output ports, and control operation of the crossing gate 15.

The controller 30 is provided with an input port, and this input port is connected to the battery cell 12 via the cell monitoring unit 21. The controller 30 analog/digital converts a voltage inputted to the input port, so as to acquire a value indicating a voltage between both electrodes of the battery cell 12.

The controller 30 is provided with other input port, and this input port is connected to a not shown current detection circuit outputting signal to be voltage corresponding to a current flowing the battery pack 11 (namely the battery cell 12). The controller 30 analog/digital converts the signal inputted to the other input port, so as to acquire a value indicating current flowing through the battery cell 12.

The controller 30 acquires voltage between both electrodes of the battery cell 12 and current then flowing, and estimates the degradation level SOH of the battery cell 12 based on a plurality of combination of these voltage and current. The controller 30 acquires voltage between both electrodes of the battery cell 12 and current then flowing, and estimates the degradation level (SOH) of the battery cell 12 based on a plurality of combinations of these voltage and current. Specifically, in a system of a coordinate in which voltage and current cross at right angles to each other, two points are plotted that correspond to combination of voltage and current (voltage differs in each combination), and an inclination of straight line connecting these two points can be acquired as an internal resistance r. Then a conversion table of SOH corresponding to the internal resistance r is pre-stored in ROM, and applying the internal resistance r to the concerned conversion table estimates the SOH.

The controller 30 detects charging rate SOH of the concerned battery cell 12 based on the voltage between both electrodes of the battery cell 12. In the present embodiment, a charge end voltage Vth for the voltage between both electrodes of the battery cell 12 is set to 4.0 V, discharge end voltage Vtl 3.0 V, voltage between these charge end voltage Vth and the discharge end voltage Vtl is assumed to vary with respect to the charging rate SOH as shown in graph in FIG. 2. Charging rate relevant information indicating relation of the voltage between both electrodes of this battery cell 12 and the charging rate SOC is previously acquired by preliminary measurement or simulation and is pre-stored in ROM in such information table format, and applying this information table to the voltage detects the charging rate SOC. Of course this is only one example, and other than this, in the case in which the voltage of the battery cell 12 and the charging rate SOH vary linearly, when the voltage of the battery cell 12 is 4.0 V, the charging rate SOH may be 100%, when 3.5 V 50%, when 3.0 V 0%. As the voltage for detecting the charging rate SOH, usage of open voltage of the battery cell 12 (voltage between both electrodes of the concerned quantity with both electrodes open (or a nearly state)) makes detection of the charging rate SOC highly accurate.

A communication port of the controller 30 is connected to a not-shown vehicle inside network (for example CAN (Controller Area Network)), and is connected to a display device such as a vehicle combination meter via the vehicle inside network. The CPU of the controller 30 transmits such a state of the battery pack 11 to the display device via the communication port and the vehicle inside network, and displays in this display device such state of the battery pack 11 in accordance with the concerned signal.

The controller 30 also detects the charging rate of the auxiliary battery 17. As one example, the controller 30 detects the concerned auxiliary battery 17 by receiving a signal indicating the charging rate of the auxiliary battery 17 from such electronic control device controlling the auxiliary battery 17, via the vehicle inside network.

Next, with reference to the flowchart in FIG. 3, one example of process the controller 30 of the controller 20 executes (charging rate leveling process 1) will be described.

In step S110, among the plurality of battery cells 12 of the battery pack 11, the battery cell 12 having the highest voltage between both electrodes (hereafter referred to as "the highest voltage battery cell 12H"), and the battery cell 12 having the lowest voltage between both electrodes (hereafter referred to as "the lowest voltage battery cell 12L") are detected. Particularly, the controller 30 outputs control signal to the cell monitoring unit 21 so as to connect successively the plurality of battery cells 12 to the controller 30 and to detect voltage between both electrodes of each of the plurality of battery cells 12. Then, the controller 30, after detecting voltage between both electrodes of all the plurality of battery cells, detects the battery cell 12 with the highest voltage as the highest voltage battery cell 12H, and the battery cell 12 with the lowest voltage as the lowest voltage battery cell 12L. Then process moves on to step S120.

In step S120, charging rate SOCH of the highest voltage battery cell 12H and charging rate SOCL of the lowest voltage battery cell 12L are detected. Specifically the controller 30 detects the charging rate SOCH based on the voltage between both electrodes of the highest voltage battery cell 12, and similarly detects the charging rate SOCL based on the lowest voltage battery cell 12L. Then process moves on to step S130.

In step S130, the controller 30 determines whether at least one of the charging rate SOCH of the highest voltage battery cell 12H and the charging rate SOCL of the lowest voltage battery cell 12 falls out of range of reference charging rate. In the present embodiments, the range of the reference charging rate is set from upper limit of 90% to lower limit of 10% for one example. Then, when at least one of the charging rate SOCH and the charging rate SOCL falls out of range of reference charging rate, process moves on to step S140 (Y in S130), and when both the charging rate SOCH and the charging rate SOCL fall out of range of the reference charging rate, process returns to step S110 (N in S130).

In step S140, the controller 30 determines whether or not differential value SOH between the charging rate SOCH and the charging rate SOCL exceeds a differential upper limit value. In the present embodiments, the differential upper limit value is set to 2% for one example. Then when the differential value Δ exceeds the differential upper limit value, process moves on to step S150 (Y in S140), and when the differential value falls below the differential upper limit value, process retunes to step S110 (N in S140).

In step S150, the controller 30 outputs control signal to the switch array 22, so as to connect the highest voltage battery cell 12H to the two-way DC-DC convertor 23. Then process moves on to step S160.

In step S160, the controller 30 outputs control signal to the two-way DC-DC convertor 23, so as to activate the two-way DC-DC convertor such that the auxiliary battery 17 is charged with electric power of the highest voltage battery cell 12H. Then process moves on to step S170.

In step S170, it is determined whether or not the auxiliary battery 17 is charged by a predetermined quantity. Specifically the controller 30 outputs control signal to the cell monitoring unit 21, so as to connect the highest voltage battery cell 12H to the controller 30, detects voltage both electrodes of the highest voltage battery cell 12H as well, and based on this voltage the charging rate SOCH of the highest voltage battery cell 12H is detected. Then, the controller 30 determines whether or not this charging rate SOCH reduces by a predetermined value (2% for example) from initiating of charge, when not reduces by the predetermined value, determining the auxiliary battery 17 is charged by the predetermined value, the determination is repeated (N in S170), and when reduces by the predetermined value, determining the auxiliary battery 17 is charged by the predetermined value, process moves on to step S180 (Y in S170). Note that in step S170, the controller 30 also detects the charging rate of the auxiliary battery 17, and when the charging rate of the auxiliary battery 17 increases to reach 100%, process moves on to step S180 so as to stop charge of the auxiliary battery 17.

In Step S180 the controller 30 outputs control signal to the two-way DC-DC convertor 23 so as to stop the two-way DC-DC convertor 23. Then process moves on to step S190.

In step S190 the controller 30 outputs control signal to the switch array 22 so as to connect the two-way DC-DC convertor 23 to the lowest voltage battery cell 12L. Then process moves on to step S200.

In step 200 the controller 30 outputs control signal to the two-way DC-DC convertor 23 so as to actuate the two-way DC-DC convertor 23 such that the lowest voltage battery cell 12L is charged with electric power of the auxiliary battery 17. Then process moves on to step S210.

In step 210 it is determined whether or not the lowest voltage battery cell 12L is charged by the predetermined value. Specifically the controller 30 outputs control signal to the cell monitoring unit 21 so as to connect the lowest voltage battery cell 12L to the controller 30 and detects the voltage between both electrodes of the lowest voltage battery cell 12L as well, and detects the charging rate SOCL of the lowest voltage battery cell 12L based on this voltage. Then the controller 30 determines whether or not this charging rate SOCL increases by the predetermined value (2% for example) from initiation of charging, and when not increases by the predetermined value, determining not charging the lowest voltage battery cell 12L by the predetermined value, process repeats the determination (N in S210), and when increases by the predetermined value, determining having charged the lowest voltage battery cell 12L by the predetermined value, process moves on to step S220 (Y in S210). Note that in step S210 the controller 30 also detects the charging rate of the auxiliary battery 17, also when the charging rate of the auxiliary battery 17 decreases to reach the predetermined lower limit (90% for example), process moves on to step S220 so as to stop charging the lowest voltage battery cell 12L.

In step S220 the controller 30 outputs the control signal to the two-way DC-DC convertor 23, so as to stop the two-way DC-DC convertor 23. Then process returns to step S110 to execute again the charging rate leveling process 1.

Execution of the abovementioned step S210 makes work the controller 30 as battery cell detector as well as cell monitoring unit, execution of the abovementioned step S120 as charging rate detector, execution of the abovementioned step S150 and S190 as connection selection controller.

Next one example of operation of the abovementioned power supply system 1 (control device 20) will be described.

The control device 20 detects voltage between both electrodes of each of the plurality of battery cells 12 the battery pack 11 of the battery module 10 includes, detecting the charging rate SOCH of the highest voltage battery cell 12H highest in these voltages and charging rate SOCL of the lowest voltage battery cell 12L lowest in these voltages (S110 and S120).

Then, when the charging rate SOCH corresponds to 91%, the charging rate SOCL 87% for example, since the charging rate SOCH falls out of the range of reference charging rate (Y in S130), and differential value between the charging rate SOCH and the charging rate SOCL exceeds the differential upper limit (Y in S140), charging the auxiliary battery 17 with electric power of the highest voltage battery cell 12H decreases the charging rate SOCH (91% to 98%) (S150 to S180, FIG. 4), then charging the lowest voltage battery cell 12L with electric power of the auxiliary battery 17 increases the charging rate SOCL (87% to 89%) (S190 to S220, FIG. 5).

Alternatively when the charging rate SOCH corresponds to 13%, the charging rate SOCL 9% for example, since the charging rate SOCL falls out of the range of referential charging rate (Y in S130), and the differential value between the charging rate SOCH and the charging rate SOCL exceeds the referential upper limit (Y in S140), charging the auxiliary battery 17 with electric power of the highest voltage battery cell 12H decreases the charging rate SOCH (13% to 11%) (S150 to S180, FIG. 4), then charging the lowest voltage battery cell 12L with electric power of the auxiliary battery 17 increases the charging rate SOCL (9% to 11%) (S190 to S220, FIG. 5).

It follows from this that the charging rate of the plurality of battery cells 12 the battery pack 11 includes is leveled.

Thus, according to the present embodiments, the control device 20 includes the two-way DC-DC convertor 23 connected to the auxiliary battery 17 separated from the battery pack 11, the switch array 22 selectively connecting each of the plurality of battery cells 12 the battery pack 11 includes to the two-way DC-DC convertor 23 so as to charge the battery cell 12 with electric power of the auxiliary battery 17, and the controller 30 controlling the switch array 22 to connect the lowest voltage battery cell 12L selected from the plurality of battery cells 12 to the two-way DC-DC convertor 23 so as to reduce the difference of the charging rate SOC of each of the plurality of battery cell 12. Thus connection of the lowest voltage battery cell 12L of which charging rate is relatively low to the two-way DC-DC convertor 23 makes it possible to charge the lowest voltage battery cell 12L with electric power of the auxiliary battery 17 capable of storing larger charge by, namely, to transfer charge so as to decrease the difference of charging rate SOC of each of the plurality of battery cells 12. Therefore, since it is possible to transfer large charge to the battery cell 12 at one transferring operation, transferring operation of charge is made reduced, and the charging rate SOC of each of the plurality of battery cells 12 the battery pack 11 includes is leveled quickly.

Furthermore, the control device 20 includes the two-way DC-DC convertor 23 connected to the auxiliary battery 17, the switch array 22 capable of selectively connecting each of plurality of battery cells 12 to the two-way DC-DC convertor 23 so as to charge the auxiliary battery 17 with electric power of the battery cell 12. And the controller 30 controls the switch array 22 so as to connect the highest voltage battery cell 12H selected from the plurality of battery cells 12 such that the difference of the charging rate SOC of each of the plurality of battery cells 12 decreases. Thus, connection of the highest voltage battery cell 12H of which charging rate SOC is relatively high to the two-way DC-DC convertor 23 makes it possible to charge the auxiliary battery 17 capable of storing relatively large charge with electric power of the highest voltage battery cell 12H, namely, to transfer charge. Therefore, since it is possible to transfer large charge at one transferring operation, transferring operation of charge is made reduced, and the charging rate SOC of each of the plurality of battery cells 12 the battery pack 11 includes is leveled quickly.

Furthermore, the controller 30 of the control device 20 detects the highest voltage battery cell 12H of which the voltage between both electrodes is highest and the lowest voltage battery cell 12L of which the voltage between both electrodes is lowest, among the plurality of battery cells 12, and also detects the charging rate SOCH of the highest voltage of the battery cell 12H and the charging rate SOCL of the lowest voltage battery cell 12L. Then, the controller 30 of the control device 20, when at least one of the charging rate SOCH of the highest voltage of the battery cell 12H and the charging rate SOCL of the lowest voltage battery cell 12L falls out of the range of the referential charging rate and the differential value ΔSOC between these charging rate SOCH and the charging rate SOCL exceeds the differential upper limit, controls the switch array 22 to connect the highest voltage battery cell 12H to the two-way DC-DC convertor 23, and then, controls the switch array 22 to connect the lowest voltage battery cell 12L to the two-way DC-DC convertor 23. Thus, the highest voltage battery cell 12H and the lowest voltage battery cell 12L are supposed to largely differ from the other battery cells 12 in charging rate, and charge can be transferred via the auxiliary battery 17 among them, and it follows from this that the charging rate SOC of each of the plurality of battery cells 12 the battery pack 11 includes is leveled quickly.

Furthermore, though in the abovementioned embodiments the cell monitoring unit 21 capable of selectively connecting each of the plurality of battery cells 12 to the controller 30, and the switch array 22 capable of selectively connecting each of the plurality of battery cells 12 to the two-way DC-DC convertor 23 are separately provided, but not limited thereto, for example, enlarging current capacity of the cell monitoring unit 21 (namely analog switch or relay device that composes them) makes it possible to selectively connect each of the plurality of battery cells 12 to the controller 30, and to the two-way DC-DC convertor 23 as well, so that the cell monitoring unit 21 may serve as the switch array 22. It follows from this that components composing the control device 20 can be reduced, resulting in reduction of manufacturing cost.

Second Embodiment

Hereinafter with reference to FIGS. 6 to 8, a charging rate leveling device of the second embodiment and a power supply system including the same will be described.

Figure 6:
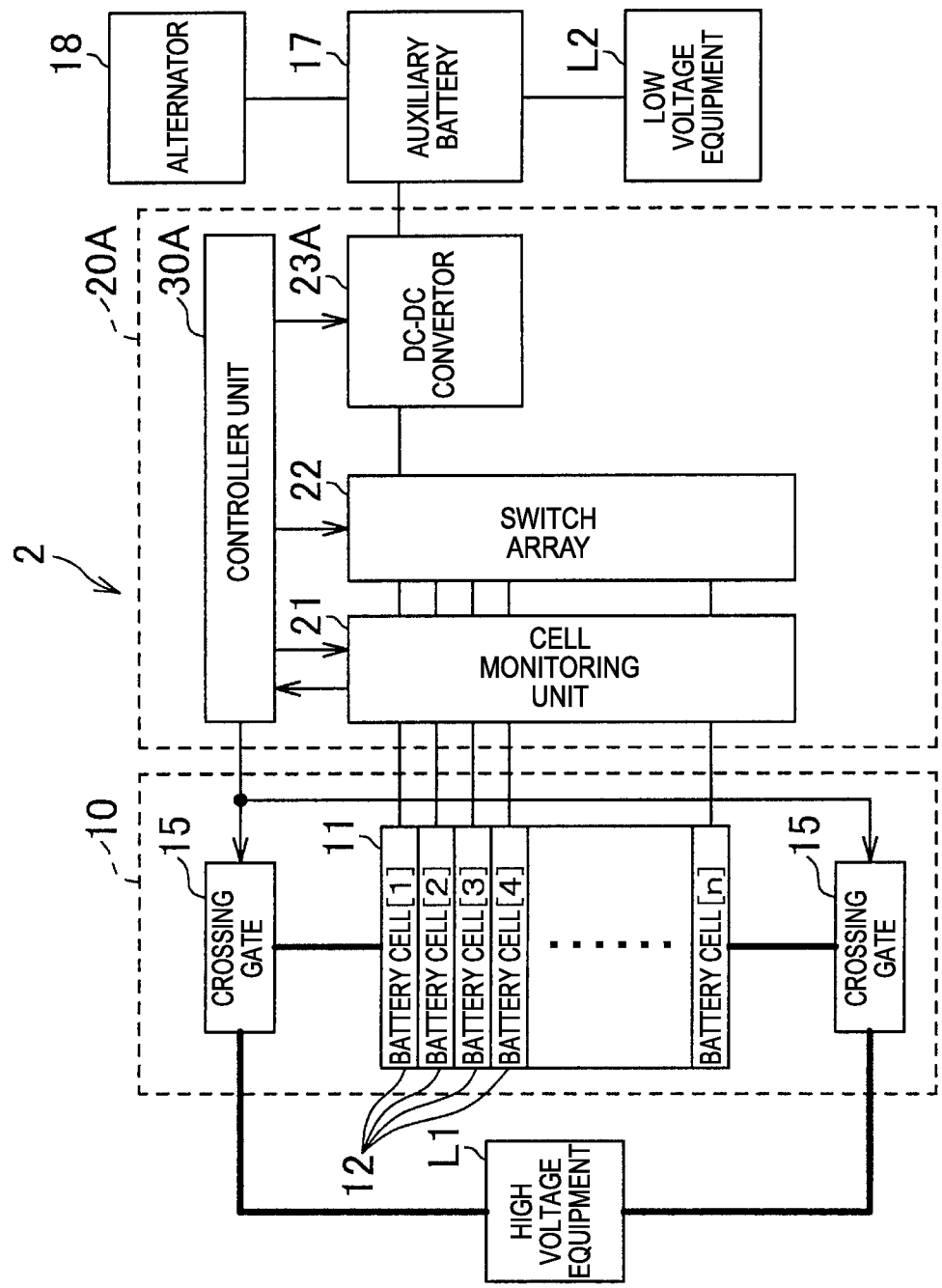
FIG. 6 is a view schematically illustrating configuration of the power supply system of second embodiment of the present invention.

FIG. 6 schematically illustrates a configuration of the power supply system of the second embodiment of the present invention. FIG. 7 is the flowchart illustrating one example of a charging rate leveling process 2 the controller of the control device of the power supply system in FIG. 6 executes. FIG. 8 is a view schematically illustrating transferring charge from the auxiliary battery to battery cell in the power supply system in FIG. 6.

The power supply system of the present embodiment, as similar to the power supply system of the abovementioned first embodiment, for example, is mounted in a vehicle such as electric vehicle, supplies electric power to a high voltage equipment such as electric motor of the vehicle, levels charging rate of the plurality of battery cells the battery pack of the power supply system includes to output more electric power as well. Of course, the present invention may be applied to a device or a system other than vehicle such as electric vehicle.

As shown in FIG. 6, the power supply system of the present embodiment (denoted as reference numeral 2 in the figure) is provided with a battery module 10, an auxiliary battery 17, an alternator 18, and a control device 20A as the charging rate leveling device. This power supply system 2 is the same configuration in the power supply system 1 of the abovementioned first embodiment as the power supply system 1 other than that the alternator 18 is added and the control device 20A is provided instead of the control device 20. Therefore, the same elements as the power supply system 1 of the first embodiment are denoted the same reference numeral and explanation will be omitted.

The alternator 18 is a generator generating electric power by power such as an engine of the vehicle. The alternator 18 is connected to the auxiliary battery 17 so as to charge the auxiliary battery 17.

The control device 20A includes a cell monitoring unit 21, a switch array 22, DC-DC convertor 23A, and a controller 30A.

The DC-DC convertor 23A is a voltage convertor converting direct current inputted from one terminal and outputting different direct current from another terminal. DC-DC convertor 23A allows the other terminal to be selectively connected to the plurality of battery cells 12 the battery pack 11 includes via the switch array 22, the one terminal is connected to the auxiliary battery 17. The DC-DC convertor 23 charges the battery cell 12 with electric power from the auxiliary battery 17. The DC-DC convertor 23 corresponds to the battery cell charger.

The controller 30A, which is composed of such microcomputer having built-in CPU, ROM, RAM, controls the power supply system 2 entirely. In the ROM is pre-stored control program for working as a various means such as connection selection controller, battery cell detector, and charging rate detector. The CPU works as abovementioned various means by executing this control program. Furthermore in the ROM is stored various parameter (reference charging rate range and differential upper limit) used for charging rate leveling process 1 mentioned below.

The controller 30A is provided with a plurality of output ports, which is connected with the cell monitoring unit 21, the switch array 22 and the DC-DC convertor 23A. The controller 30A outputs control signal from the output ports so as to switch connection of the cell monitoring unit 21 and the switch array 22, or control operation of the DC-DC convertor 23A. Furthermore the output ports of the controller 30A is also connected to a crossing gate 15 of the battery module 10, and output control signal from the output ports so as to control operation of the crossing gate 15.

The controller 30A is provided with an input port, which is connected to the battery cell 12 via the cell monitoring unit 21. The controller 30A analog/digital converts voltage inputted from the input port so as to obtain a value indicating voltage between both electrodes of the battery cell 12.

The controller 30A is provided with other input port, which is connected to a not-shown current detection circuit outputting a signal to become voltage corresponding to current flowing through the battery pack 11 (namely the battery cell 12). The controller 30A converts the signal inputted to the other input port so as to obtain value indicating current flowing through the battery cell 12.

The controller 30A obtains voltage between both electrodes of the battery cell 12 and current at the time flowing, and based on a plurality of combination of these voltage and current, degradation level SOH of the battery cell 12 is estimated. Specifically in a coordinate system in which voltage and current are orthogonal to each other, two points making a combination of voltage and current as a coordinate are plotted (voltage is different in each combination), an inclination of a line connecting two points can be obtained as an internal resistance r. Translation table of the SOH corresponding to the internal resistance r is then pre-stored into the ROM, and applying the internal resistance r to the translation table allows for estimation of SOH.

The controller 30A detects the charging rate SOC of the battery cell 12 based on the voltage between both electrodes of the battery cell 12. In the present embodiment, charge end voltage Vth in the voltage between both electrodes of the battery cell 12 is set to 4.0 V, discharge end voltage Vtl 3.0 V, the abovementioned voltage is assumed to change linearly with respect to the charging rate SOC between these charge end voltage Vth and discharge end voltage Vtl. Namely, when the voltage between both electrodes of the battery cell 12 is 4.0 V, the charging rate SOC becomes 100%, when the voltage is 3.5 V, the charging rate SOC becomes 50%, and when the voltage is 3.0 V, the charging rate SOC becomes 0%. Of course this is one example, other than this, as shown in FIG. 2 for example in the case that the voltage between both electrodes of the battery cell 12 and the charging rate SOC does not change linearly, the charging rate related information is preliminarily made and stored in ROM, such as a table related to relation between the voltage and the charging rate SOC through preliminary measure or simulation, and applying a detected voltage to this charging rate related information may detect the charging rate SOC.

The communication port of the controller 30A is connected to such a not-shown in-vehicle network (CAN (Controller Area Network) or the like), and connected to a display device such as combination meter in the vehicle via the in-vehicle network. The CPU of the controller 30A transmits such a state of the battery pack 11 via the communication port and in-vehicle network to the display device, the state of the battery pack 11 is displayed based on the signal on this display device.

The controller 30A also detects the charging rate of the auxiliary battery 17. For one example, the controller 30A receives a signal indicating the charging rate of the auxiliary battery 17 from such an electronic control device controlling the auxiliary battery 17 via the in-vehicle network, thereby detecting the charging rate of the auxiliary battery 17.

Figure 7:
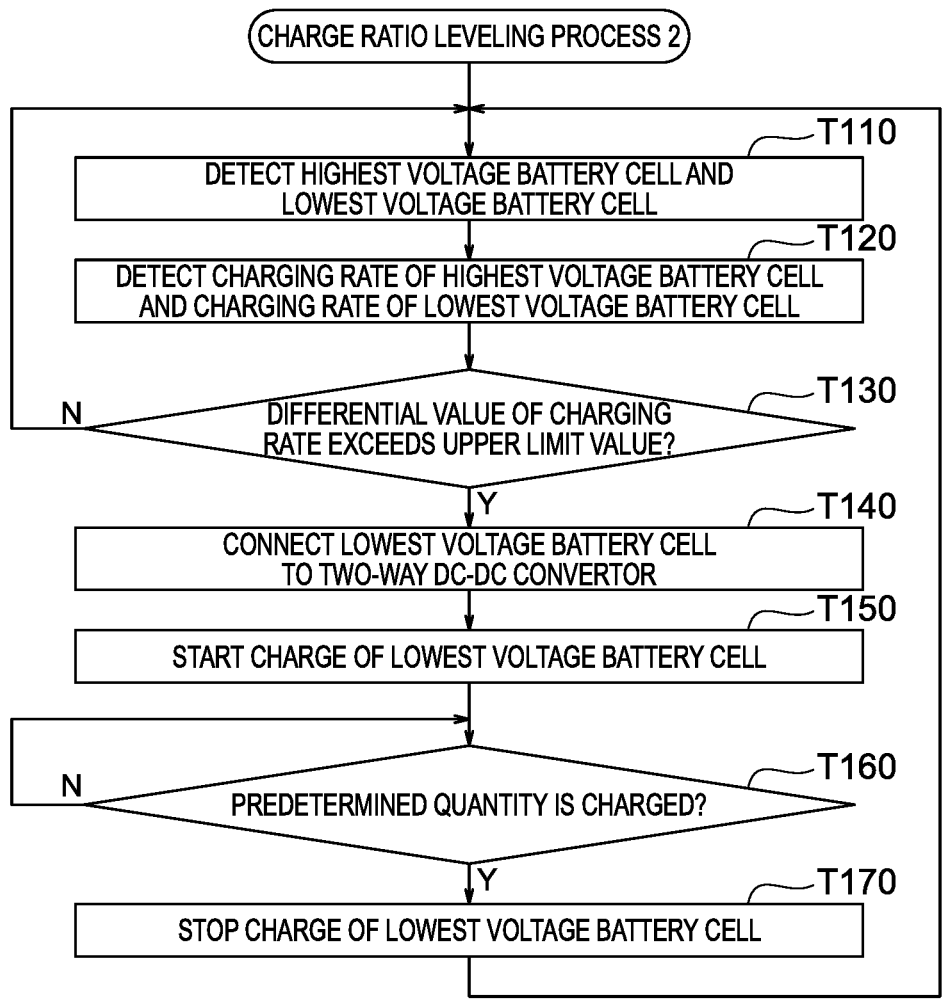
FIG. 7 is a flowchart illustrating one example of charging rate leveling process 2 the controller of the control device of the power supply system in FIG. 6 performs.
Figure 8:
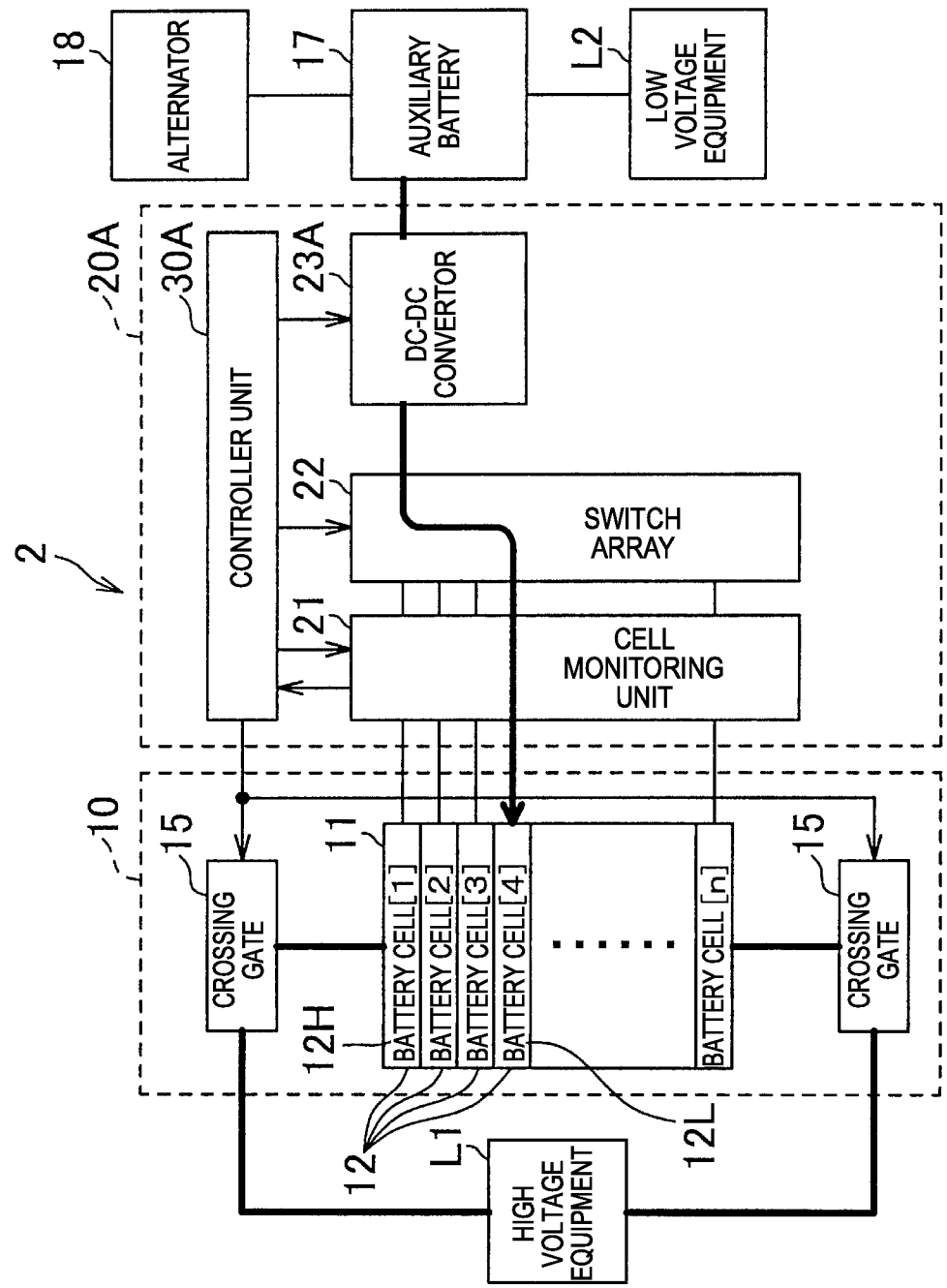
FIG. 8 is a view schematically illustrating transferring of electric charge from the auxiliary battery to the battery cell in the power supply system in FIG. 6.

Next, with reference to a flowchart in FIG. 7 one example of a process (charging rate leveling process 2) the controller 30A of the abovementioned control device 20A executes.

In step T110, among the plurality of battery cells 12 of the battery pack 11 the battery cell 12 of which a voltage between both electrodes is the highest (hereafter referred to as "the highest voltage battery cell 12H"), and the battery cell 12 of which the voltage between both electrodes is the lowest (hereafter referred to as "the lowest voltage battery cell 12L") are detected. Particularly, the controller 30A outputs a control signal to a cell monitoring unit 21 so as to connect successively the plurality of battery cells 12 to the controller 30A and to detect voltage between electrodes of each of the plurality of battery cells 12. Then, the controller 30, after detecting voltage between both electrodes of all the plurality of battery cells, detects the battery cell 12 of which the voltage is the highest as the highest voltage battery cell 12H, and the battery cell 12 of which the voltage is the lowest as the lowest voltage battery cell 12L. Then process moves on to step T120.

In step T120, charging rate SOCH of the highest voltage battery cell 12H and charging rate SOCL of the lowest voltage battery cell 12L are detected. Specifically the controller 30A detects the charging rate SOCH based on the voltage between both electrodes of the highest voltage battery cell 12, and similarly detects the charging rate SOCL based on the lowest voltage battery cell 12L. Then process moves on to step T130.

In step T130, the controller 30A determines whether a different value ΔSOC between the charging rate SOCH and the charging rate SOCL exceeds the difference upper limit value. In the present embodiments, the differential upper limit value is set to 2% for one example. Then, when the different value ΔSOC exceeds the differential upper limit value, process moves on to step T140 (Y in T130), and when the different value ΔSOC is below the differential upper limit value, process returns to step T110 (N in T130).

In step T140, the controller 30A outputs control signal to the switch array 22 so as to connect the lowest voltage battery cell 12L to the DC-DC convertor 23A. Then process moves on to step T150.

In step T150, the controller 34A outputs control signal to the DC-DC convertor 23A so as to work the DC-DC convertor 23A to charge the lowest voltage battery cell 121 with electric power of the auxiliary battery 17. Then process moves on to step T160.

In step S160, it is determined whether or not the lowest voltage battery cell 12L is charged by the predetermined charge. Specifically the controller 30A outputs control signal to the cell monitoring unit 21, so as to connect the lowest voltage battery cell 12L to the controller 30A, detects voltage between both electrodes of the lowest voltage battery cell 12L, as well, and based on this voltage the charging rate SOCL of the lowest voltage battery cell 12L is detected. Then, the controller 30A determines whether or not this charging rate SOCL increases by the predetermined value (2% for example) from initiating of charge, when the predetermined value does not increase, determining the lowest voltage battery cell 12L is not charged by the predetermined value, the determination is repeated (N in step T160), and when the predetermined value increases by the predetermined value, determining the lowest battery cell 12L is charged by the predetermined value, process moves on to step T170 (Y in step 160). Note that in step T160, the controller 30A also detects the charging rate of the auxiliary battery 17, and also when the charging rate of the auxiliary battery 17 decreases to reach 0%, process moves on to step T170 so as to stop charge of the lowest voltage battery cell 12L.

In Step 170, the controller 30A outputs control signal to the two-way DC-DC convertor 23A so as to stop the two-way DC-DC convertor 23A. Then process returns to step T110 to execute again the charging rate leveling process 2.

Execution of the abovementioned step T110 makes the controller 30 work as battery cell detector, execution of the abovementioned step T120 as charging rate detector, execution of the abovementioned step T140 as connection selection controller.

Next one example of operation of the abovementioned power supply system 2 (control device 20A) will be described.

The control device 20A detects voltage between both electrodes of the plurality of battery cells 12 the battery pack 11 of the battery module 10 includes, detecting the charging rate SOCH of the highest voltage battery cell 12H having highest voltage of this voltage and charging rate SOCL of the lowest voltage battery cell 12L having lowest voltage of this voltage (T110 and T120).

Then, when the charging rate SOCH corresponds to 82%, the charging rate SOCL 79%, for example, differential value between the charging rate SOCH and the charging rate SOCL exceeds the differential upper limit (Y in T130), the auxiliary battery 17 is charged with electric power of the highest voltage battery cell 12H to increase the charging rate SOCL (79% to 81%) (T140 to T170, and FIG. 7).

Alternatively, when the charging rate SOCH corresponds to 27%, and the charging rate SOCL 24% for example, differential value between the charging rate SOCH and the charging rate SOCL exceeds the differential upper limit (Y in T130), the lowest voltage battery cell 12L is charged with electric power of the auxiliary battery 17 to increase the charging rate SOCL (24% to 26%) (T140 to T170, and FIG. 7).

It follows from this that the charging rate of the plurality of battery cells 12 the battery pack 11 includes can be leveled.

Thus, according to the present embodiments, the control device 20A includes the two-way DC-DC convertor 23A connected to the auxiliary battery 17 separated from the battery pack 11, the switch array 22 selectively connecting each of the plurality of battery cells 12 the battery pack 11 includes to the two-way DC-DC convertor 23A so as to charge the battery cell 12 with electric power of the auxiliary battery 17, and the controller 30 controlling the switch array 22 to connect the lowest voltage battery cell 12L selected from the plurality of battery cells 12 to the two-way DC-DC convertor 23 so as to reduce the difference of the charging rate SOC of each of the plurality of battery cell 12. Thus it is possible to charge the lowest voltage battery cell 12L with electric power of the auxiliary battery 17 capable of storing relatively large charge by connecting the lowest voltage battery cell 12L of which charging rate is relatively low to the two-way DC-DC convertor 23, namely, to transfer charge so as to decrease the difference of charging rate SOC of each of the plurality of battery cells 12. Since it is possible to transfer large charge to the battery cell 12 at one transferring operation, transferring operation of charge is made reduced, and the charging rate SOC of each of the plurality of battery cells 12 the battery pack 11 includes is leveled quickly.

Furthermore, the controller 30A of the control device 20A detects the highest voltage battery cell 12H of which the voltage between both electrodes is highest and the lowest voltage battery cell 12L of which the voltage between both electrodes is lowest among the plurality of battery cells 12, and also detects the charging rate SOCH of the highest voltage of the battery cell 12H and the charging rate SOCL of the lowest voltage battery cell 12L. Then, the controller 30A of the control device 20, when the differential value ΔSOC between these charging rate SOCH and the charging rate SOCL exceeds the differential upper limit, controls the switch array 22 to connect the lowest voltage battery cell 12L to the two-way DC-DC convertor 23A. Thus, the lowest voltage battery cell 12L is supposed to differ from the other battery cells 12 in charging rate SOC and charge can be transferred from the auxiliary battery 17, and it follows from this that the charging rate SOC of each of the plurality of battery cells 12 the battery pack 11 includes is leveled quickly.

As mentioned above, though the present invention has been described taking preferred embodiments, the charging rate leveling device and the power supply system are not limited to configuration of these embodiments.

For example, though the abovementioned embodiments were configured such that after charge of the highest voltage battery cell 12H is transferred (namely the auxiliary battery 17 is charged with electric power of the highest voltage battery cell 12H), charge of the auxiliary battery 17 is transferred to the lowest voltage battery cell 12L (namely the lowest voltage battery cell 12L is charged with electric power of the auxiliary battery 17), the invention is not limited thereto. For example, it may be configured such that charge of a plurality of battery cells 12 with relatively high charging rate is successively transferred to the auxiliary battery 17, charge of the auxiliary battery 17 with relatively low charging rate is successively transferred to the plurality of battery cells 12.

Furthermore, though the abovementioned second embodiment is configured that charge of the auxiliary battery 17 was transferred to the lowest voltage battery cell 12L (namely the lowest voltage battery cell 12L is charged with electric power of the auxiliary battery 17), the invention is not limited thereto. For example, it may be configured that charge of the auxiliary battery 17 is successively transferred until each of the other plurality of battery cells 12 except the highest voltage battery cell 12H becomes the same charging rate as the charging rate of the highest voltage battery cell 12H Furthermore, though the abovementioned first embodiment is configured that operations that transferring charge of the highest voltage battery cell 12H is transferred to the lowest voltage battery cell 12L and that transferring charge of the auxiliary battery 17 is transferred to the lowest voltage battery cell 12L are exclusively performed, the invention is not limited thereto. For example, it may be configured such that instead of the two-way DC-DC convertor 23, a discharging DC-DC convertor charging (transferring charge) the auxiliary battery 17 with electric power of the battery cell 12 and a charging DC-DC convertor charging the battery cell 12 with electric power of the auxiliary battery 17 are provided and perform each above operations at the same time.

Note that the aforementioned embodiments are to merely indicate typical forms of the present invention, but the present invention is not limited thereto. Namely, those skilled in the art can change and perform the invention without departing from gist of the present invention according to conventional known knowledge. Such variations, as far as still include the charging rate leveling device and the power supply system of the present invention regardless of variations of course fall within a scope of the present invention.

DESCRIPTION OF SYMBOLS 1, 2 power supply system
10 battery module
11 battery pack
12 battery cell
12H highest voltage battery cell
12L lowest voltage battery cell
15 crossing gate
17 auxiliary battery
18 alternator
20, 20A control device (charging rate leveling device)
21 cell monitoring unit (battery cell detector, voltage detecting connection selector)
22 switch array (charging connection selector, discharging connection selector)
23 two-way DC-DC convertor (battery cell charger, auxiliary battery charger)
23A DC-DC convertor (battery cell charger)
30, 30A controller (connection selection controller, battery cell detector, charging rate detector, voltage detector)
L1 high voltage equipment
L2 low voltage equipment

The invention claimed is:

1. A charging rate leveling device for leveling charging rate of a plurality of battery cells in a battery pack, the charging rate leveling device comprising:
   a battery cell charger connected to an auxiliary battery separated from the battery pack;
   a connection selector capable of selectively connecting each of the plurality of battery cells to the battery cell charger, so as to charge the battery cell with electric power of the auxiliary battery;
   a connection selector controller controlling the connection selector to connect one battery cell selected from the plurality of battery cells to the battery cell charger so as to reduce a difference in charging rates among the plurality of battery cells; and
   an alternator directly connected only to the auxiliary battery to directly charge only the auxiliary battery,
   a battery cell detector detecting a highest voltage battery cell and a lowest voltage battery cell, the highest voltage battery cell having a highest voltage between both electrodes and the lowest voltage battery cell having a lowest voltage between both electrodes, among the plurality of battery cells; and
   a charging rate detector detecting a charging rate of the highest voltage battery cell and a charging rate of the lowest voltage battery cell,
   wherein the battery cell charger is also configured to charge the auxiliary battery with electric power of the battery cell,
   the connection selector is also configured to selectively connect each of the plurality of battery cells to the battery cell charger, so as to discharge the battery cell, and
   the connection selector controller, when at least one of the charging rate of the highest voltage battery cell and the charging rate of the lowest voltage battery cell falls out of a range of a reference charging rate and a difference value between the charging rates exceeds a difference upper limit value, controls the connection selector to connect the highest voltage battery cell to the auxiliary battery charger so as to charge the auxiliary battery with the highest voltage battery cell until the charging rate of the highest voltage battery cell decreases by a predetermined value, and then controls the connection selector to connect the lowest voltage battery cell to the battery cell charger so as to charge the lowest voltage battery cell with the auxiliary battery until the charging rate of the lowest voltage battery cell increases by a predetermined value.

2. The charging rate leveling device according to claim 1, wherein the battery cell detector includes one voltage detector, and a voltage detecting connection selector capable of selectively connecting each of the plurality of battery cells to the voltage detector, and wherein
   the voltage detecting connection selector is configured to also serve as the connection selector by allowing each of the plurality of battery cells to be selectively connected also to the battery cell charger.

3. A power supply system comprising the battery pack and the charging rate leveling device according to claim 2.

4. A power supply system comprising the battery pack and the charging rate leveling device according to claim 1.

* * * * *